United States Patent [19]

Kirsch

[11] Patent Number: 4,672,243
[45] Date of Patent: Jun. 9, 1987

[54] ZERO STANDBY CURRENT TTL TO CMOS INPUT BUFFER

[75] Inventor: Howard C. Kirsch, Emmaus, Pa.

[73] Assignee: American Telephone and Telegraph Company, AT&T Bell Laboratories, Murray Hill, N.J.

[21] Appl. No.: 738,593

[22] Filed: May 28, 1985

[51] Int. Cl.⁴ .................... H03K 17/10; H03K 19/094
[52] U.S. Cl. ................... 307/475; 307/443; 307/451; 307/585
[58] Field of Search ............ 307/443, 451, 475, 576, 307/579, 585, 264, 279

[56] References Cited

U.S. PATENT DOCUMENTS

| T955,006 | 2/1977 | Cavaliere et al. | 307/585 |
|---|---|---|---|
| 3,675,144 | 7/1972 | Zuk | 307/443 |
| 4,258,272 | 3/1981 | Huang | 307/475 |
| 4,408,136 | 10/1983 | Kirsch | 307/475 |
| 4,437,025 | 3/1984 | Liu et al. | 307/475 |
| 4,438,352 | 3/1984 | Mardkha | 307/475 |
| 4,463,273 | 7/1984 | Dingwall | 307/579 |
| 4,471,242 | 9/1984 | Noufer et al. | 307/475 |
| 4,475,050 | 10/1984 | Noufer | 307/475 |
| 4,490,633 | 12/1984 | Noufer et al. | 307/475 |
| 4,501,978 | 2/1985 | Gentile et al. | 307/475 |
| 4,574,273 | 3/1986 | Atsumi et al. | 307/475 |
| 4,584,491 | 4/1986 | Ulmer | 307/475 |

Primary Examiner—Stanley D. Miller
Assistant Examiner—Timothy P. Callahan
Attorney, Agent, or Firm—Wendy W. Koba

[57] ABSTRACT

A TTL to CMOS input buffer (20) which prevents static current flow when the TTL input signal is at a relatively low voltage logic "1" state. A transition detector (44) responsive to the input TTL logic signal and a voltage boosting circuit (50) connected between a positive power supply (VDD) and the input to a first CMOS inverter (30) are utilized to sense an input signal "0" to "1" transition and boost the TTL logic "1" signal to a voltage level which will prevent the p-channel transistor (32) included in the CMOS inverter from turning "on". The voltage boosting circuit will subsequently be disconnected from the input to the p-channel transistor to prevent the input from being fully charged to the positive power supply.

5 Claims, 3 Drawing Figures

ZERO STANDBY CURRENT TTL TO CMOS INPUT BUFFER

BACKGROUND OF THE INVENTION

1. Technical Field

The present inventin relates to a TTL to CMOS input buffer and, more particularly, to a TTL to CMOS input buffer wherein a transition detector and an additional pair of MOS devices are included in the circuit to prevent current flow through the buffer circuit.

2. Description of the Prior Art

For many applications, it is desirable to provide a circuit which is capable of interfacing between transistor-transistor logic (TTL) levels and complementary MOS (CMOS) logic levels. In particular, TTL logic levels are nominally +2.4 V for a logic "1" and 0.4 V for a logic "0", and the associated CMOS levels are nominally +5.0 V and 0.0 V. The conventional interface circuit, also referred to in the art as an "input buffer circuit", comprises a p-channel MOS transistor and an n-channel MOS transistor connected in series between a positive power supply VDD (usually 5 V) and ground. The gates of the devices are connected together and responsive to the TTL input signal. The drains of the transistors are also connected together and provide the CMOS output signal. This arrangement is considered in the art as a typical CMOS inverter circuit. In the ideal situation, one transistor of the pair will always be "off", preventing any current to flow through the pair of transistors from VDD to ground. However, this is not always the case. In particular, problems arise at the TTL input level for a logic "1", 2.4 V, and when the TTL input level for a logic "0" is somewhat greater than 0.4 V, for example, 0.8 V. At these levels, the both transistors may be "on" and a current will flow through the transistor pair to ground.

There are many arrangements which exist in the prior art to solve this problem. One particular solution is disclosed in U.S. Pat. No. 4,471,242 issued to G. E. Noufer et al on Sept. 11, 1984. The current flow through the devices is eliminated in this arrangement by introducing a reference voltage to match the lowest level of a logic "1" of the TTL input signal. This reference voltage is utilized in place of VDD as the supply voltage to the p-channel transistor, thus preventing the p-channel transistor from turning "on" when its gate voltage is at the lowest TTL logic "1" input level. A problem with this arrangement, however, is that by reducing the supply voltage of the p-channel transistor, the operating range of the buffer circuit is also restricted. By lowering the voltage available to operate the transistors, therefore, the device will be inherently slower. For many applications, this is not acceptable.

As an alternative solution, the actual sizes of the p- and n-channel transistors may be modified to prevent the static current flow. However, this solution is not practical since it requires additional masking levels and, therefore, additional processing time. Further, it is difficult with this method to accurately control the device sizes so as to reproducibly provide the necessary threshold voltage.

Therefore, a need remains in the prior art for a TTL to CMOS input buffer which will not draw any static current, does not require additional processing steps, and is capable of operating over the entire 0–5 V CMOS power supply level.

SUMMARY OF THE INVENTION

The problems associated with the prior art have been solved in accordance with the present invention which relates to a TTL to CMOS input buffer and, more particularly, to a TTL to CMOS input buffer which utilizes a transition detector and an additional pair of MOS devices to prevent static current flow when the TTL logic "1" input signal is at relatively low levels.

It is an aspect of the present invention to utilizes a pair of p-channel MOS transistors connected in series between the positive power supply and the gates of a first CMOS inverter to control the gate-to-source voltage of the p-channel transistor included in the inverter and maintain the p-channel transistor in the "off" state for low logic "1" input levels.

A further aspect of the present invention is to provide the TTL input signal as an input to the transition detector, where the output from the transition detector is applied as the gate input to one of the additional p-channel transistors.

Other and further aspects of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
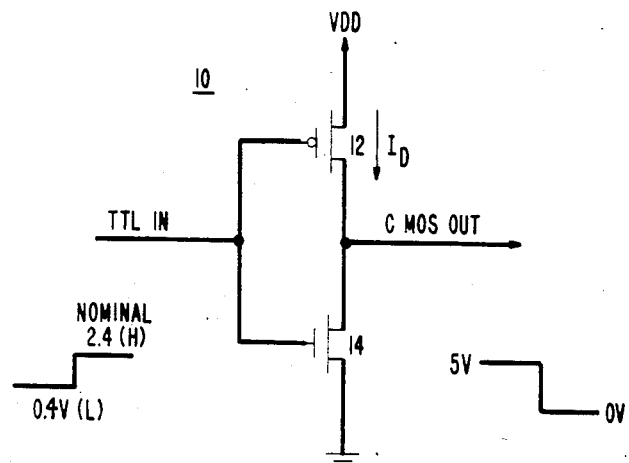
FIG. 1 illustrates a simple prior art CMOS inverter which may be utilized to shift TTL logic level input signals to CMOS logic level output signals.
Figure 2:
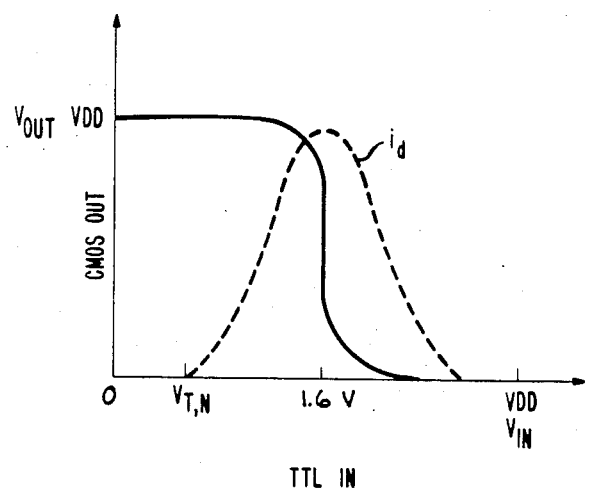
FIG. 2 is a graph illustrate the voltage transfer function, as well as static current flow, for the device illustrated in FIG. 1.

As stated above, a conventional TTL input buffer for a CMOS circuit essentially includes a CMOS inverter. One such prior art CMOS input buffer 10 is illustrated in FIG. 1. Input buffer 10 includes a p-channel MOS transistor 12 and an n-channel MOS transistor 14 connected in series between a positive power supply (denoted VDD) and a negative power supply, presumably, ground. The gates of transistors 12 and 14 are connected together and receive as an input signal $V_{IN}$, the TTL input logic signal. Similarly, the drains of transistors 12 and 14 are connected together and provide the CMOS logic output signal, here denoted $V_{OUT}$. As shown in FIG. 1, a logic "0" to a logic "1" transition in TTL relates to a step change in voltage from approximately 0.4 V to approximately 2.4 V. In operation, when the input signal is at the logic "0" value, p-channel transistor 12 will be turned "on" and n-channel transistor 14 will be turned "off". Therefore, the voltage at node 0 will be approximately the positive supply voltage VDD, where VDD is typically 5 V. When the TTL input signal is a logic "1", transistor 12 will be turned less "on", transistor 14 turned "on", and the voltage at node 0 will drop to near 0 V, or ground. FIG. 2 illustrates the transfer function ($V_{OUT}$ vs $V_{IN}$) of the circuit illustrated in FIG. 1. Referring to the transfer function, when $V_{IN}$ is equal to 0 V $V_{OUT}$ will be at its maximum potential of VDD, or 5 V. As $V_{IN}$ approaches 1.6 V, both transistors 12 and 14 will be turned "on", and $V_{OUT}$ will switch from VDD to ground. As can be seen by reference to FIG. 2, the switch is not instantaneous, and there exists a predetermined voltage interval wherein $V_{IN}$ provides a sufficient gate voltage to both transistors so as to override their respective threshold voltages. This is the interval wherein static current will flow from VDD through transistors 12 and 14 to ground. A representation of this static current, denoted $i_d$, is also illustrated in FIG. 2. As stated above, it is necessary in many applications to reduce, or even better, eliminate, this current flow. To achieve this, therefore, it is necessary to ensure that both transistors forming the CMOS inverter are never in conduction at the same time.

Figure 3:
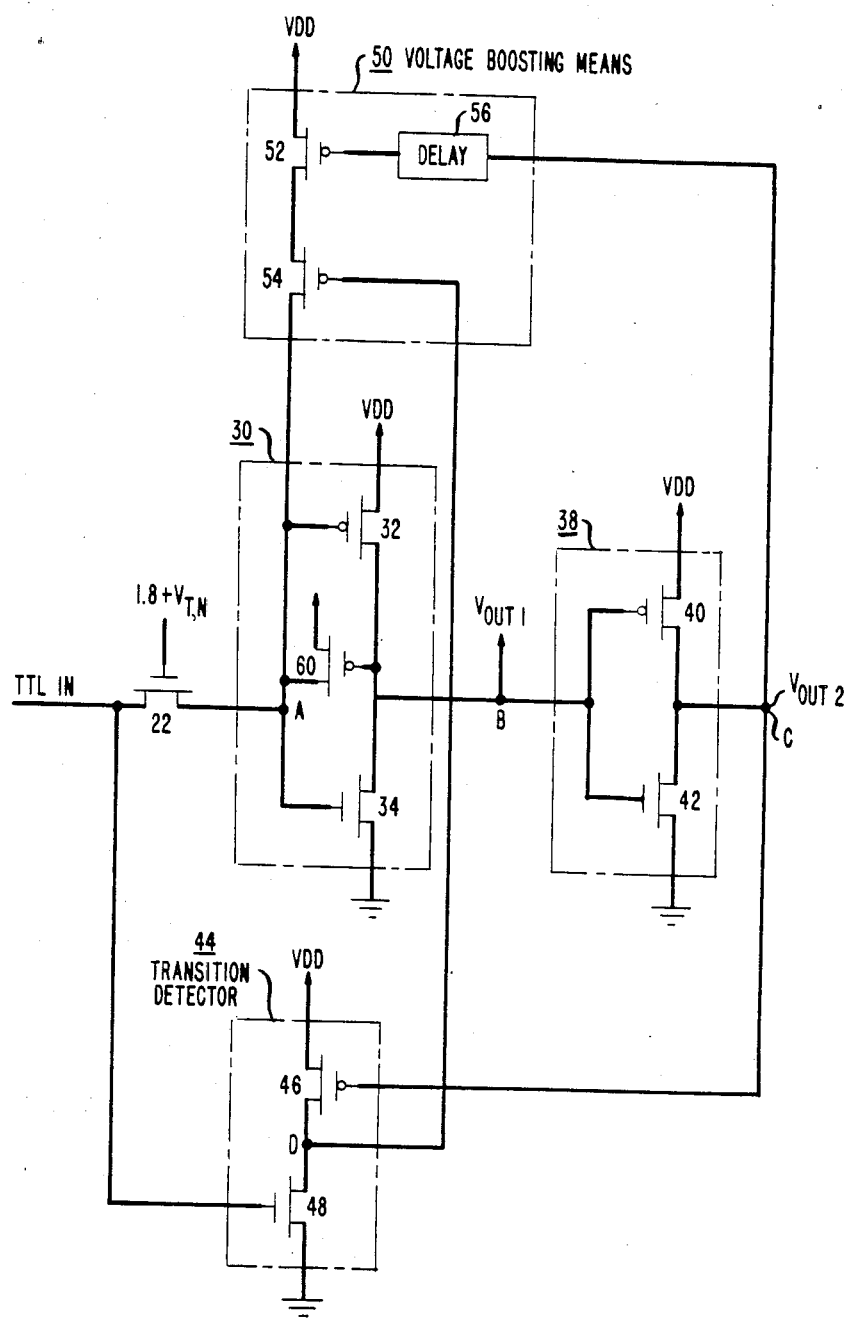
FIG. 3 illustrates an exemplary TTL to CMOS input buffer without static current flow formed in accordance with the present invention.

Shown in FIG. 3 is a TTL to CMOS input buffer 20 formed in accordance with the present invention which eliminates the static current flow is through the p-channel and n-channel transistors. In general, input buffer 20 comprises a first CMOS inverter 30, a second CMOS inverter 38, a transition detector 44, and a voltage boosting circuit 50. The TTL logic input signal $V_{IN}$ is applied as an input to the first CMOS inverter 30 via an n-channel transistor 22, where the source of transistor 22 is connected to receive input signal $V_{IN}$. The gate of transistor 22 is controlled by a reference voltage $V_{ref}$, and the drain of transistor 22 is connected to the input of first CMOS inverter 30, where this connection is illustrated as node A in FIG. 3. First CMOS inverter 30 comprises, as shown in FIG. 3 a p-channel transistor 32 and an n-channel transistor 34 connected in series between the positive power supply VDD and ground. The gates of transistors 32 and 34 are coupled together and connected to the drain of transistor 22 at node A. The drains of transistors 32 and 34 are also coupled together and provide the output of first inverter 30 at node B, where this output signal is defined as $V_{OUT1}$. Output signal $V_{OUT1}$ is provided at essentially VDD when input signal $V_{IN}$ is a logic "0" and at essentially ground when input signal $V_{IN}$ is a logic "1".

The output of first CMOS inverter 30 is subsequently applied as an input to second CMOS inverter 38. Second CMOS inverter 38 is similar in structure to first CMOS inverter 30 and comprises a p-channel transistor 40 and an n-channel transistor 42 connected between VDD and ground. The output of second CMOS inverter 38, denoted $V_{OUT2}$, will be the opposite of the output from first CMOS inverter 30. In general, the portion of the circuit described thus far can be considered as a standard TTL to CMOS buffer well known in the art. For the purposes of discussion, the operation of this circuit will be briefly described before discussing the enhancement in circuit performance achieved as a result of the additional circuitry of the present invention.

When input signal $V_{IN}$ is a logic "1", transistor 22 must be "off". Therefore, the reference voltage $V_{ref}$ is chosen to ensure that transistor 22 will remain "off" when the TTL input signal is at its lowest logic "1" value of approximately 2 V. Thus, the input to first inverter 30 at node A will be approximately 1.8 V, including some noise margin. One of the advantages of utilizing transistor 22 that the input inverter transistors 32 and 34 do not have to be ratioed to accept TTL input levels, since device 22 enables node A to go fully to VCC. This logic "1" value turns "on" n-channel transistor 34 and turns "off" p-channel transistor 32, pulling the voltage appearing at node B, $V_{OUT1}$, to ground. Consequently, this logic "0" value of $V_{OUT1}$ is applied as the input to second inverter 38, turning p-channel transistor 40 "on" and n-channel transistor 42 "off" and bringing the value of output signal $V_{OUT2}$ to essentially VDD, or logic "1". In summary, therefore, when the TTL input signal $V_{IN}$ is a logic "1", $V_{OUT1}$ will be a logic "0" and $V_{OUT2}$ will be a logic "1", where the actual values of $V_{OUT1}$ and $V_{OUT2}$ will be the CMOS voltage levels of ground (0 v) and VDD (5 V), respectively. Similarly, when input signal $V_{IN}$ is a logic "0", transistor 32 of first inverter 30 will turn "on" and transistor 34 will turn "off", thus bringing the voltage at node B from up from ground to essentially VDD, the CMOS logic "1" level. In turn, this logic "1" input to second inverter 38 will turn transistor 40 "off" and transistor 42 "on", bringing the output of second inverter 38 down from VDD to ground, the CMOS logic "0" level.

As briefly stated above in association with FIG. 1, the problem arises when the TTL input signal $V_{IN}$ is at its lowest logic "1" value of 2 V. Under this condition, both transistors 32 and 34 will be "on" and will draw a current is from VDD to ground. Under some circumstances, this current may reach a value of 3 A, which is not acceptable for many situations. To avoid this situation, therefore, it is necessary to bring the TTL logic "1" input voltage of 2 V appearing at node A up to a level which is sufficient to ensure that p-channel transistor 32 will be completely turned "off". This solution is provided in accordance with the present invention by including a transition detector 44 and a voltage boosting circuit 50 in input buffer 20.

Transistor detector 44 comprises a p-channel transistor 46 and an n-channel transistor 48. The source of transistor 46 is connected to VDD, the drain is connected to the drain of transistor 48, and the gate is coupled to receive the output signal $V_{OUT2}$ from second inverter 38. The source of transistor 48 is connected to ground and the gate of transistor 48 is coupled to receive the TTL input signal $V_{IN}$. The output of transition detector 44, denoted $V_{TRANS}$, will appear at node D, the interconnected drain terminals of transistors 46 and 48. Voltage boosting circuit 50, as shown in FIG. 3, comprises a pair of p-channel transistors 52 and 54 connected in series between VDD and node A, the input to first inverter 30. In particular, the source of transistor 52 is connected to VDD, the drain of transistor 52 is connected to the source of transistors 54, and the drain of transistor 54 is connected to node A. The gate of transistor 52 is controlled by output signal $V_{OUT2}$ from second inverter 38 and the gate of transistor 54 is controlled by output signal $V_{TRANS}$ from transition detector 44. As seen be reference to FIG. 3, a delay element 56 is included in boosting circuit 50, where the purpose of this device will be explained in detail below.

As previously discussed, conventional TTL to CMOS input buffers will draw a static current $I_d$ when the TTL input signal makes a logic "0" to a logic "1" transition, where the logic "1" signal is of insufficient magnitude to turn "off" the p-channel transistor of the CMOS inverter. In accordance with the operation of the present invention, when $V_{IN}$ moves from a logic "0" to a logic "1" value, transistor 48 of transition detector 44 will turn "on", bringing the output $V_{TRANS}$ of detector 44 to ground. This CMOS logic "0" value of $V_{TRANS}$ is subsequently applied as the gate input of p-channel transistor 54, turning "on" transistor 54. At this point in time, the signal appearing at the gate of p-channel transistor 52 will also be at ground, since the TTL input transition from logic "0" to logic "1" has not yet propagated through delay element 56. Therefore, once transistor 54 is activated, node A will be brought up from the TTL logic "1" value of approximately 2 V towards the full VDD CMOS logic "1" level. Thus, with node A sufficiently above the threshold of p-channel transistor 32, transistor 32 will remain "off" and no current will flow through first inverter 30. As can be seen from the above description, delay element 56 (which may simply comprise a pair of CMOS inverters) functions to ensure that transistor 52 will not be turned "off" (by the transition of $V_{OUT2}$ from "0" to "1" in association with the identical transition of input signal $V_{IN}$) until transistor 54 has been "on" long enough to bring the voltage at node A to a level which will turn transistor 32 "off". It is been determined that a delay of approximately 10–15 nsec is sufficient for this purpose.

Once the logic "1" value of $V_{OUT2}$ has propagated through delay element 56 and reaches the gate of transistor 52, transistor 52 will be turned "off", thereby disconnecting node A from VDD. Transistor 52 is turned "off" so that when input signal $V_{IN}$ makes its next transition from logic "1" to logic "0", node A is not actively held at VDD, where that condition would draw current from the TTL input source, which is not desirable. Also, it would considerably slow down the "1" to "0" transition time and thus decrease the operating speed of input buffer 20.

A problem may be encountered when the input signal $V_{IN}$ remains at a logic "1" value for a considerable length of time. Under these circumstances, the voltage at node A may decay to a level which would allow p-channel transistor 32 to turn "on" and static current to flow through inverter 30. To alleviate this problem, a p-channel leakage transistor 60 may be included in first inverter 30 of input buffer 20 as shown in FIG. 3. Leakage transistor 60 is connected at its source to VDD, and the drain of transistor 60 is connected to node A. The gate of transistor 60 is connected to node B, thus transistor 60 will turn "on" when output signal $V_{OUT1}$ is at a logic "0" value. By design, transistor 60 is made to be extremely small, and will therefore not interfere with the operation of voltage boosting circuit 50. However, after transistor 52 has been "off" for a given length of time, transistor 60 will provide a path for leakage current so that static current will not flow from VDD through transistors 32 and 34 to ground. Due to its extremely small size, the current flow through leakage transistor 60 is considered negligible.

In summary, the present invention comprises a TTL to CMOS input buffer with virtually no static current flow. This condition is achieved by utilizing a transition detector in association with a voltage boosting circuit to provide a voltage at the input of a first CMOS inverter which will keep the p-channel transistor of the inverter "off" regardless of the voltage level of the TTL logic "1" input signal.

What is claimed is:

1. A TTL to CMOS input buffer for receiving an input signal having one of the first ("0") and second ("1") logic states, at the associated TTL voltage levels, and providing an output logic signal corresponding thereto at the associated CMOS voltage levels without drawing any appreciable current therethrough, said input buffer comprising
   a first CMOS inverter responsive to said TTL input logic signal for producing as an output a first CMOS logic signal of opposite logic state;
   a second CMOS inverter responsive to the first CMOS logic signal produced by said first CMOS inverter for providing as an output a second CMOS logic signal of like logic state as said TTL input logic signal;
   a transition detector responsive to both said TTL input logic signal and said second CMOS logic signal for generating as an output a transition output control signal; and
   voltage boosting means responsive to both said second CMOS logic signal and said transition output control signal for providing an increased voltage signal at the input to said first CMOS inverter when said TTL input logic signal changes from the first logic state to the second logic state.

2. A TTL to CMOS input buffer as defined in claim 1 wherein the transition detector comprises
   a first transistor of a first conductivity type having a first current electrode coupled to a first power supply, a second current electrode for providing the transition output control signal, and a gate electrode for receiving as an input the second CMOS logic signal; and
   a second transistor of a second conductivity type having a first current electrode coupled to a second power supply, a second current electrode to the second current electrode of said first transistor, and a gate electrode for receiving as an input the TTL input logic signal.

3. A TTL to CMOS input buffer as defined in claims 1 or 2 wherein the voltage boosting means comprises
   delay means responsive to the second CMOS logic signal for producing as an output a delayed second CMOS logic signal;
   a first transistor of a first conductivity type having a first current electrode coupled to a first power supply, a second current electrode, and a gate electrode responsive to the delayed CMOS logic signal; and
   a second transistor of the first conductivity type having a first current electrode coupled to the second current electrode of said first transistor, a second current electrode coupled to the input of the first CMOS inverter, and a gate electrode responsive to the transistor output control signal produced as an output by the transistor detector.

4. A TTL to CMOS input buffer as defined in claim 1, or wherein
   the first CMOS inverter comprises
   a first transistor of a first conductivity type having a first current electrode coupled to a first power supply, a second current electrode for providing a first CMOS logic signal output, and a gate electrode for receiving the TTL logic input signal; and
   a second transistor of a second conductivity type having a first current electrode coupled to a second power supply, a second current electrode coupled to the second current electrode of said first transistor, and a gate electrode for receiving said TTL logic input signal; and
   the second CMOS inverter comprises
   a first transistor of the first conductivity type having a first current electrode coupled to the first power supply, a second current electrode for providing a second CMOS logic signal output, and a gate electrode for receiving the first CMOS logic signal output of said first CMOS inverter; and a second transistor of the second conductivity type having a first current electrode coupled to the second power supply, a second current electrode coupled to the second current electrode of the first transistor of said second CMOS inverter, and a gate electrode for receiving said first CMOS logic signal output of said first CMOS inverter.

5. A TTL to CMOS input buffer as defined in claim 4 wherein the first CMOS inverter further comprises a third transistor of the first conductivity type having a first current electrode coupled to the first power supply, a second current electrode coupled to the gate electrode of the first transistor, and a gate electrode for receiving the first CMOS logic signal output of said first CMOS inverter, wherein said third transistor is significantly smaller in dimension than the first and second transistors of said first CMOS inverter.

* * * * *

UNITED STATES PATENT AND TRADEMARK OFFICE
CERTIFICATE OF CORRECTION

PATENT NO.  :   4,672,243

DATED       :   June 9, 1987

INVENTOR(S) :   Howard Clayton Kirsch

It is certified that error appears in the above-identified patent and that said Letters Patent is hereby corrected as shown below:

Column 6, line 45, "transistor" should be --transition--.
Column 6, line 46, "transistor" should be --transition--.

Signed and Sealed this

Twenty-fourth Day of November, 1987

*Attest:*

DONALD J. QUIGG

*Attesting Officer*　　　　　*Commissioner of Patents and Trademarks*